Figure 1:
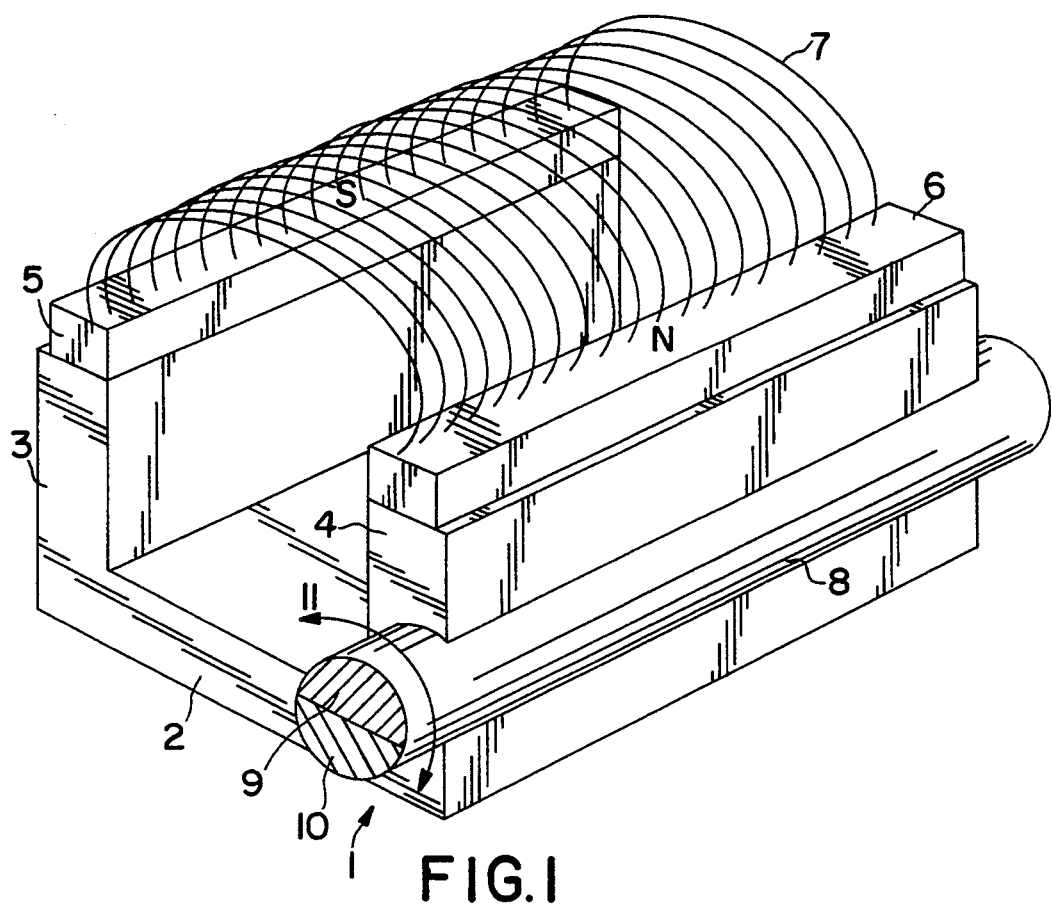

United States Patent [19]

Gebele

[11] Patent Number: 5,345,207

[45] Date of Patent: Sep. 6, 1994

[54] MAGNET CONFIGURATION WITH PERMANENT MAGNETS

[75] Inventor: Thomas Gebele, Freigericht, Fed. Rep. of Germany

[73] Assignee: Leybold Aktiengesellschaft, Hanau, Fed. Rep. of Germany

[21] Appl. No.: 997,110

[22] Filed: Dec. 24, 1992

Related U.S. Application Data

[63] Continuation of Ser. No. 802,301, Dec. 4, 1991.

[30] Foreign Application Priority Data

Jan. 25, 1991 [DE] Fed. Rep. of Germany ....... 4102102

[51] Int. Cl.$^5$ .......................... C23C 14/00; H01F 3/00
[52] U.S. Cl. .................................. 335/298; 335/211; 335/302; 204/298.16
[58] Field of Search .............................. 335/210–212, 335/336, 337, 285–288, 295–298, 302, 304, 306; 315/5.35; 250/396 ML; 204/298.16–298.22, 298.37

[56] References Cited

U.S. PATENT DOCUMENTS

| | | | |
|---|---|---|---|
| 3,452,310 | 11/1966 | Israelson | 335/295 |
| 3,582,017 | 6/1971 | Zecca | 335/306 |
| 4,250,478 | 2/1981 | Cardone et al. | 335/288 |
| 4,376,272 | 3/1983 | Osakabe | 335/211 |
| 4,465,993 | 8/1984 | Braillon | 335/287 |
| 4,636,756 | 1/1987 | Ito | 335/298 |
| 4,974,512 | 12/1990 | Russo | 335/288 |
| 5,079,481 | 1/1992 | Moslehi | 204/298.37 |
| 5,097,240 | 3/1992 | Nakanishi | 335/296 |

FOREIGN PATENT DOCUMENTS

| | | | |
|---|---|---|---|
| 0253344 | 1/1988 | European Pat. Off. | H01J 37/34 |
| 0283095 | 9/1988 | European Pat. Off. | 204/298.2 |
| 869995 | 1/1953 | Fed. Rep. of Germany. | |
| 885451 | 6/1953 | Fed. Rep. of Germany. | |
| 2901554C2 | 2/1990 | Fed. Rep. of Germany | H01J 23/10 |
| 0056580 | 4/1984 | Japan | 204/298.2 |
| 1-165771 | 9/1989 | Japan | C23C 14/36 |
| 0263272 | 10/1989 | Japan | 204/298.16 |
| 1309965 | 12/1989 | Japan | 204/298.2 |
| 0011761 | 1/1990 | Japan | 204/298.2 |
| 1-279754 | 1/1990 | Japan | C23C 14/36 |
| 2004965 | 1/1990 | Japan | 204/298.72 |
| 2034780 | 2/1990 | Japan | 204/298.2 |
| 2-107764 | 7/1990 | Japan | C23C 14/35 |

Primary Examiner—Leo P. Picard
Assistant Examiner—Raymond Barrera
Attorney, Agent, or Firm—Koda and Androlia

[57] ABSTRACT

The invention relates to a magnet configuration with permanent magnets (5, 6) around a yoke (2, 3, 4) connecting these permanent magnets (5, 6). The magnetic field strength of this magnet configuration is varied thereby that in the region of the yoke (2, 3, 4) at least one rotatable body (8) is provided which comprises at least two spatially separated materials (9, 10) with different magnetic properties.

14 Claims, 7 Drawing Sheets

MAGNET CONFIGURATION WITH PERMANENT MAGNETS

This is a continuation of application Ser. No. 802,301, filed Dec. 4, 1991.

The invention relates to a magnet configuration with permanent magnets and a yoke connecting these permanent magnets.

In sputtering techniques magnets are often used which generate a magnetic field influencing the path of electrically charged particles. Herein the electrically charged particles are as a rule accelerated through an electrical field so that the magnetic field has an effect superimposed on the influence of the electrical field. Configurations of this type are referred to as magnetrons. If the electrical field is effective between a heating filament as cathode and a cylindrical anode coaxial with it a magnetron of this type is also called a velocity-modulated electron tube and applied as oscillation generator or amplifier in microwave technology. In the sputtering technique, however, anode and cathode are opposed in the form of a diode so that through the superimposed magnetic field an electron-cyclotron resonance is generated. Installed in the cathode or combined with it are permanent magnets which are connected with one another via a yoke. By yoke is understood a connecting piece of iron or Similar material which lowers the magnetic reluctance between two permanent magnets.

In general, in the known sputtering cathodes nonvariable magnetrons are used in which the permanent magnets can at best be adjusted before the installation.

However, configurations have already been suggested in which onto the field of a permanent magnet is superimposed the field of a current-carrying coil and consequently is varied. Due to the problems which are encountered with respect to placing and current feeding with coils in magnetrons such configurations are not very common.

A further method for varying subsequently the magnetic field of a permanent magnet comprises moving the permanent magnet mechanically toward a given region or away from it. However, this is not a genuine change of the magnetic fields but rather a field strength variation through an increase or decrease of the distance in a given region of influence.

It is also already known to move a ferromagnetic ledge between a set of magnets and a target for the purpose of influencing a magnetic field (Patents Abstracts of Japan:1-165771 A. C-640, Sep. 26, 1989, Vol.13/No. 431; 1-27954 A. C-682, Jan. 29, 1990, Vol. 14, No. 47; 2-107764 A. C-737, Jul. 5, 1990, Vol. 14/No. 314). Hereby no effective decrease of the field strength can be obtained, but only a deformation of the field strength. Further, the magnets cannot be disposed in direct vicinity of the target, but a gap has to be provided between the magnet and the target for allowing to move the control ledge.

Further a permanent magnet configuration is known wherein two permanent magnets are disposed in the direction of a common longitudinal axis, whereby a magnetically conducting transition piece is displaced between the two permanent magnets (DE-C-29 01 554). This arrangement is, however, relatively cumbersome since the first partial permanent magnet adjacent to the working air gap must have a higher flux density and a lower coercive force than the second partial permanent magnet.

In a magnetostatic lens arrangement it is known to provide cylindrical permanent magnet systems being disposed coaxially to the path of rays of an electron microscope, wherein the field strength can be influenced DE-C-869 995, DE-C-885 451. The regulating effect is achieved by a short circuit generated directly at the magnet. However, it is a disadvantage that the regulation requires a linear movement of a control ring in an axial direction by applying a great force.

Finally, a sputtering cathode according to the magnetron principle is known comprising three permanent magnetic magnet units displaced one into the other as well as a mechanical adjusting device whereby the magnetic flux between a magnet yoke and at least one magnet unit can be varied with respect to the magnetic flux of the magnet yoke and the other magnet units (EP-A-0 253 344). Hereby the variability of the magnetic flux is mainly due to the lifting and lowering of a central magnet. The variability of the magnetic resistance in the yoke is a secondary effect only. When the central magnet is not dragged considerable forces are necessary for moving the central yoke opening.

The invention is based on the task of having available the possibility of varying the magnetic field subsequently and in simple manner by 10% to 20%.

This task is solved according to the features of Patent claim 1.

The advantage achieved with the invention resides in particular therein that the magnetic field of a magnetron can be varied in simple manner even during the operation of for example a sputtering cathode. Moreover, it is possible with the invention to improve the basic setting of the magnetic field.

Figure 2:
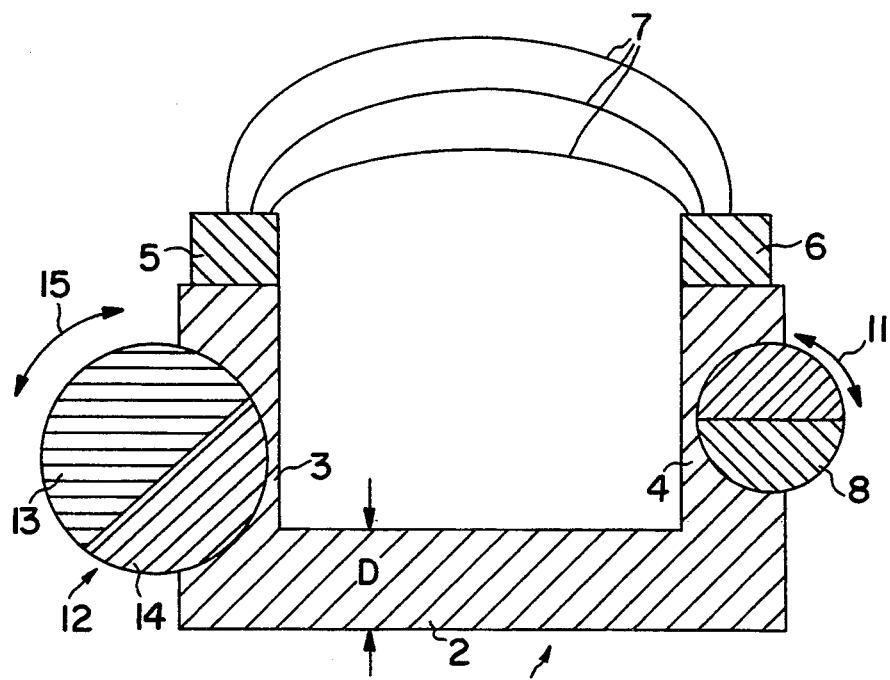
Figure 3:
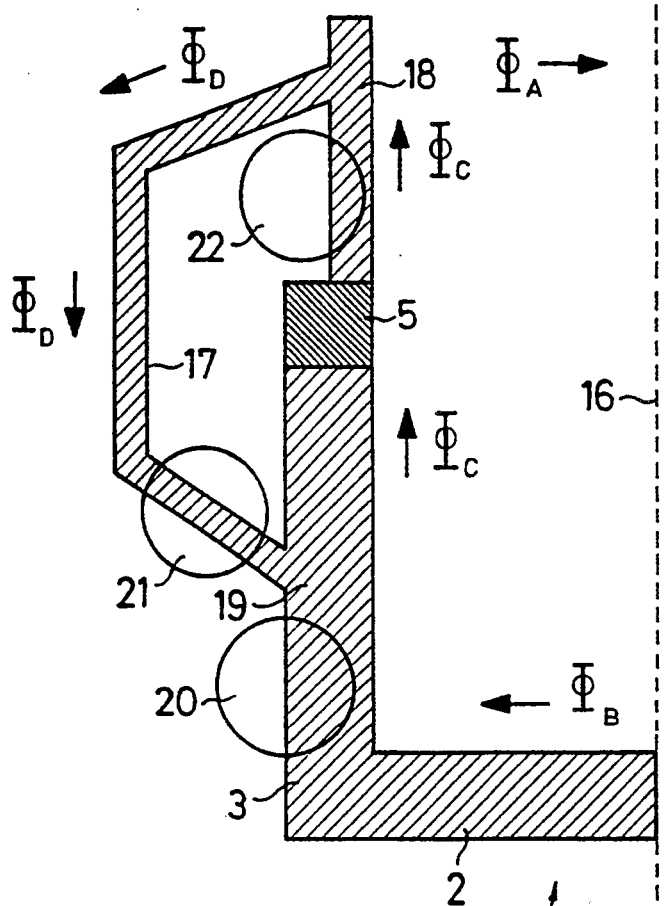
Figure 4A:
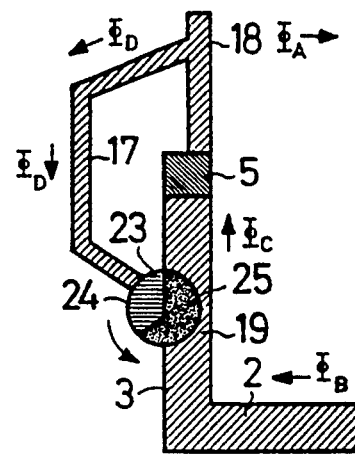
Figure 4B:
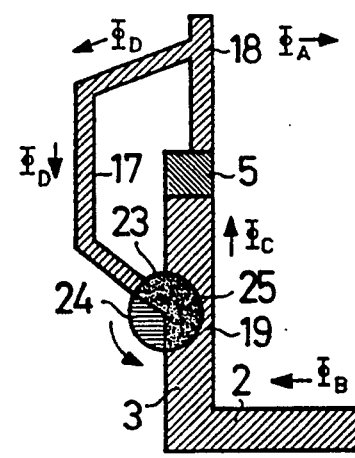
Figure 4C:
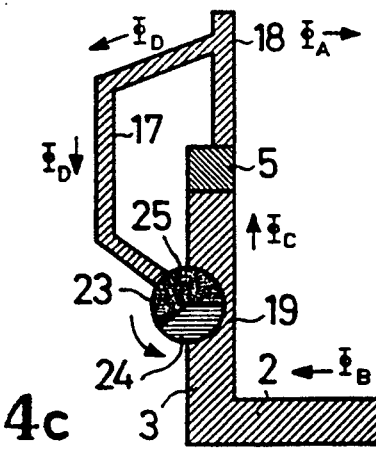
Figure 5:
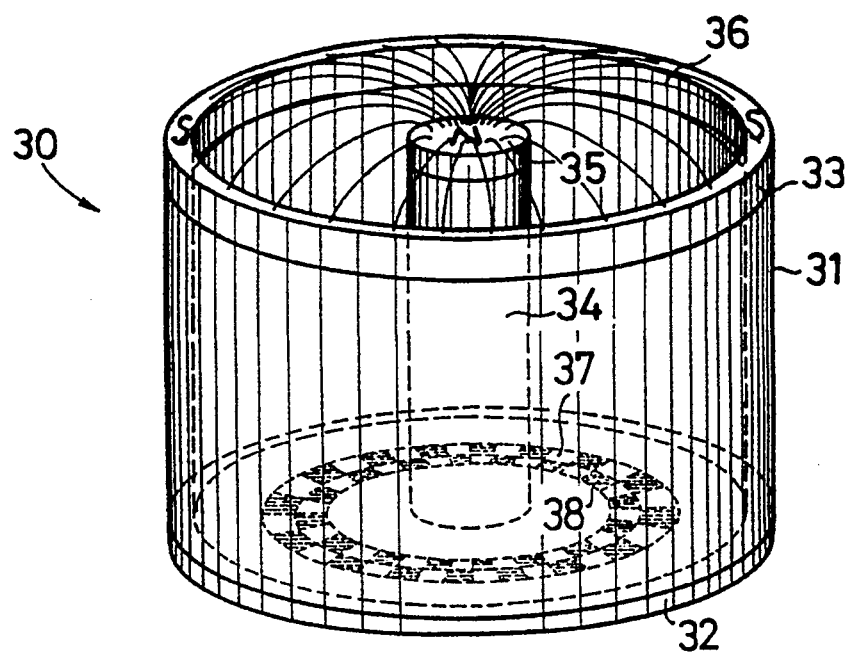
Figure 6:
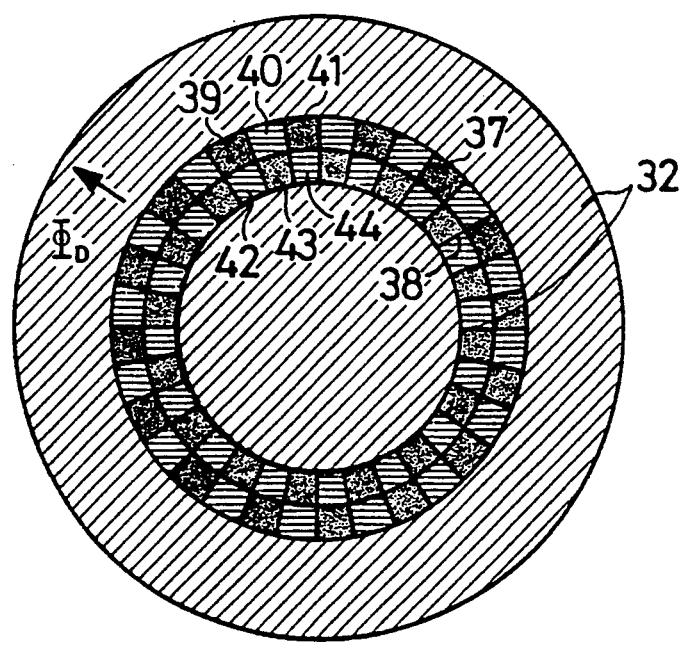
Figure 7:
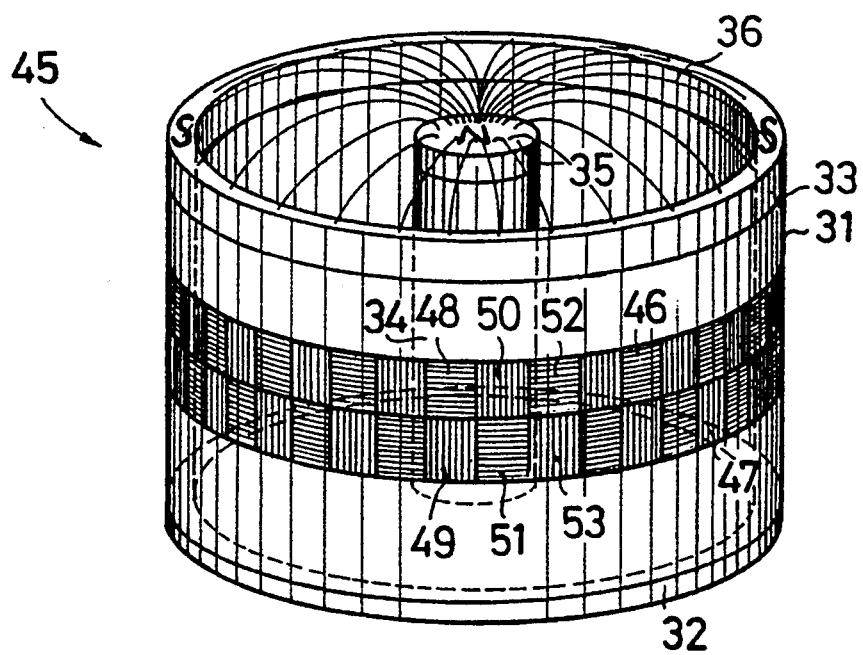
Figure 8:
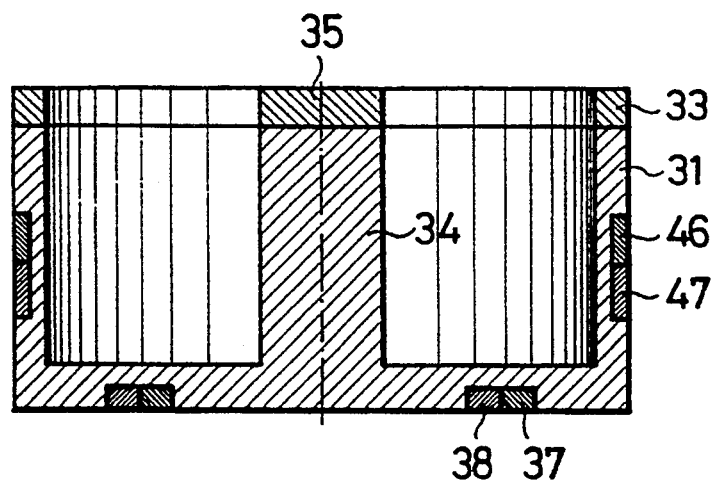
Figure 9A:
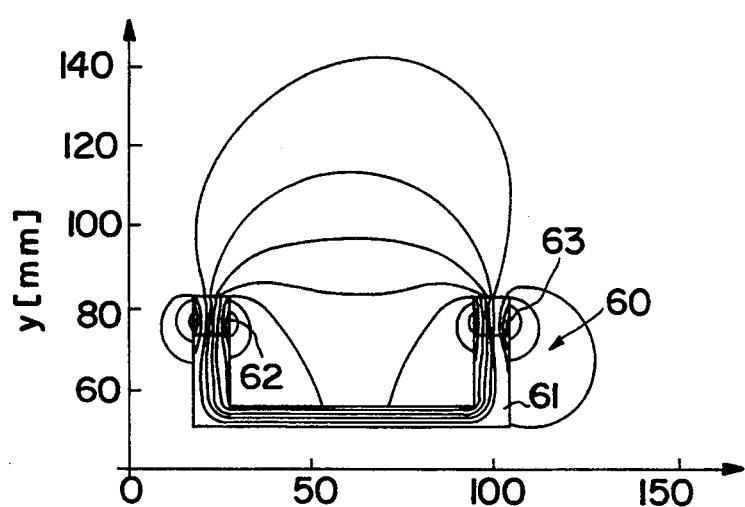
Figure 9B:
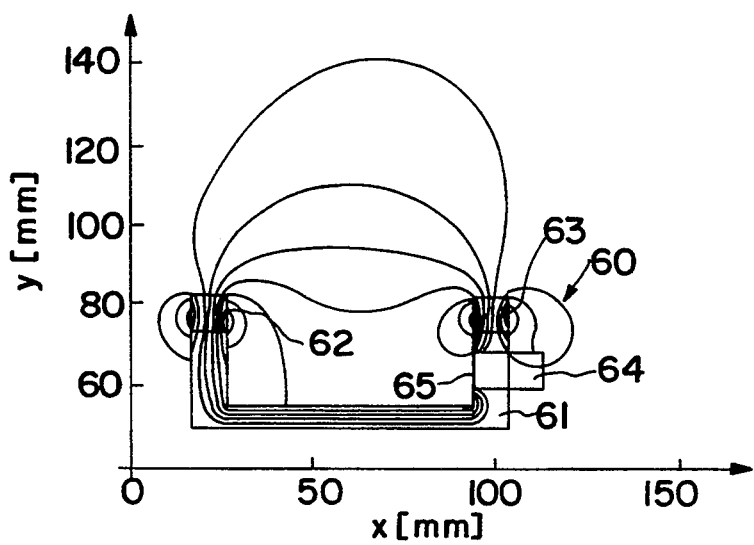
Figure 9C:
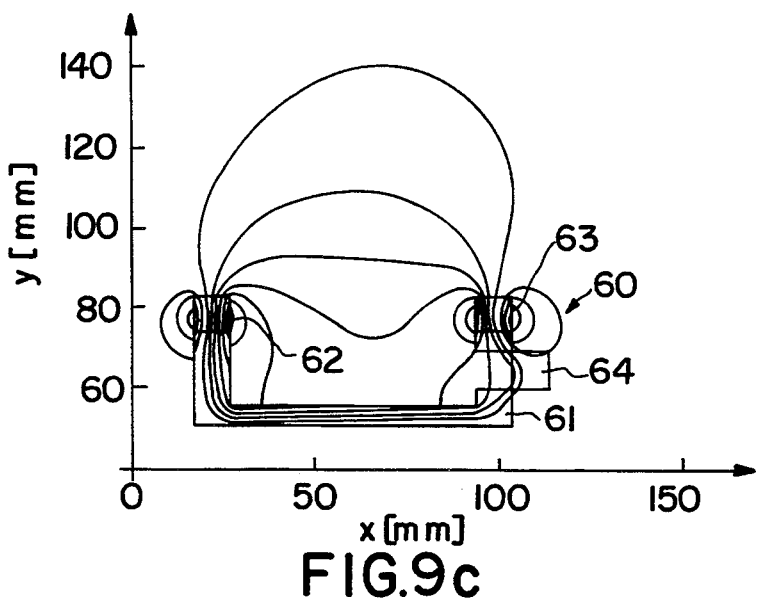
Figure 10A:
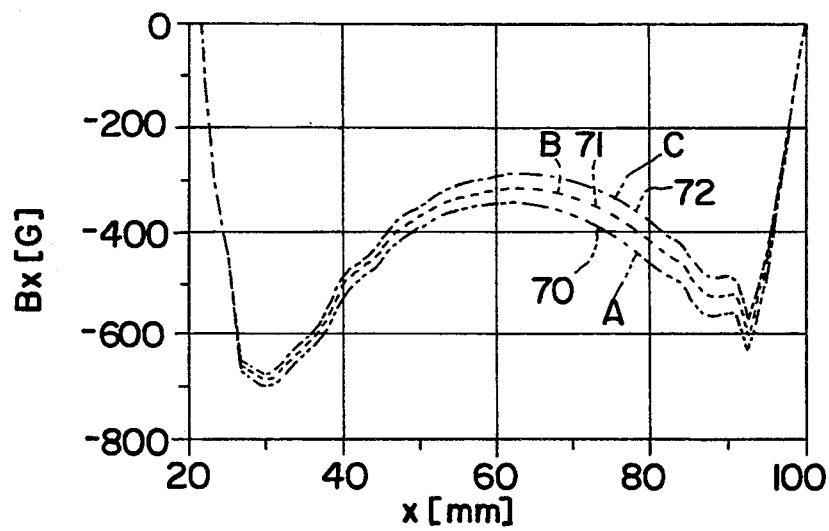
Figure 10B:
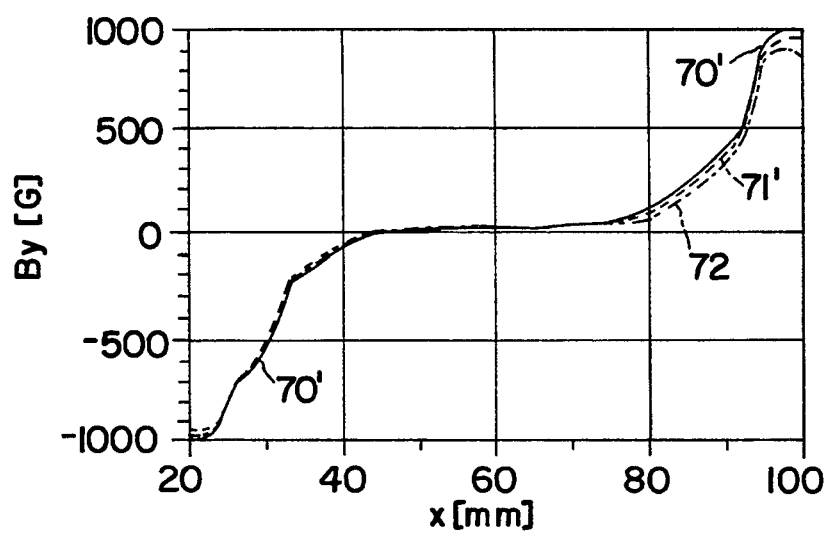
Figure 10C:
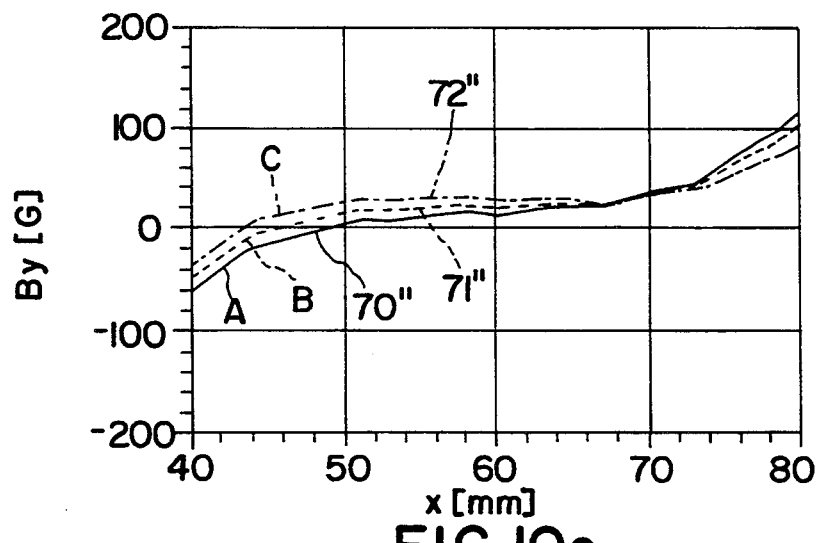
Figure 11:
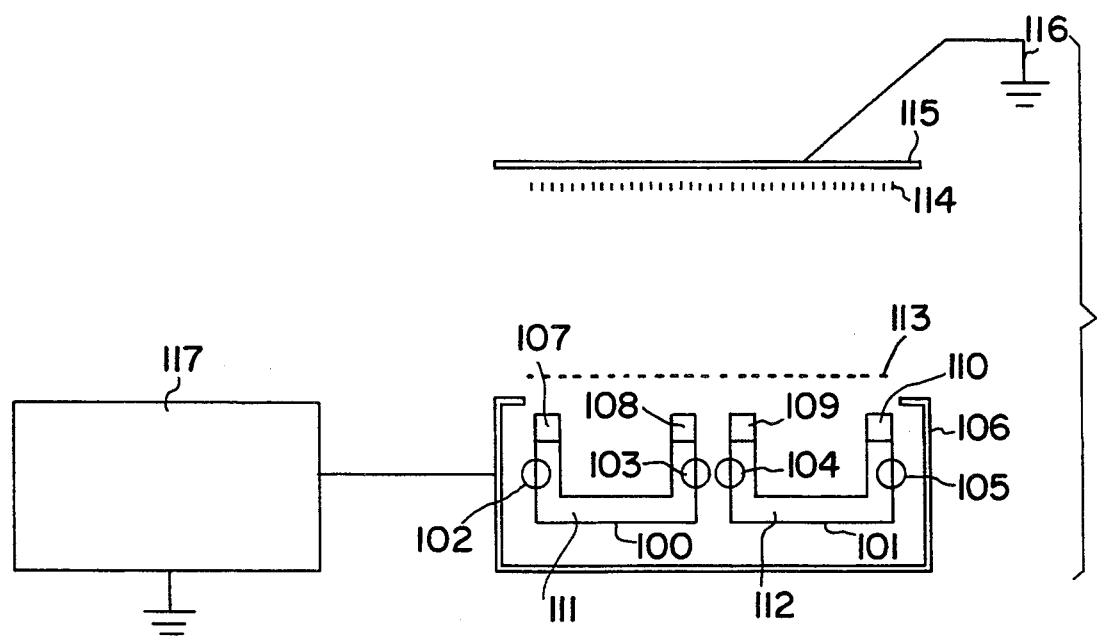

Embodiment examples of the invention are represented in the drawings and are described in greater detail in the following. Therein show:

FIG. 1 a perspective view of a U-form magnet with a yoke, two permanent magnets, and a control rod;

FIG. 2 a cross section through a magnet according to the invention with yoke and two control rods with different diameters;

FIG. 3 a half-side representation of a magnet with a magnetic flux return and three places for the insertion of control rods;

FIG. 4a a magnet according to FIG. 3 in which a control rod is disposed at the transition site between yoke shank and magnetic flux return and assumes a first position;

FIG. 4b the magnet according to FIG. 4a wherein the control rod assumes a second position;

FIG. 4c the magnet according to FIG. 4a wherein the control rod assumes a third position;

FIG. 5 a perspective representation of a rotationally symmetrical magnet configuration with control rings on the floor of the housing;

FIG. 6 a top view onto the floor of a rotationally symmetrical magnet configuration according to FIG. 5;

FIG. 7 a perspire representation of a second rotationally symmetrical magnet configuration with control rings on the housing wall;

FIG. 8 a sectional representation through a third rotationally symmetrical magnet configuration with control rings on the floor and on the housing wall;

FIG. 9a the vector potential of an uninfluenced magnet;

FIG. 9b the vector potential of a magnet whose yoke is largely provided with a recess;

FIG. 9c the vector potential of a magnet whose yoke at one place is completely interrupted by a recess;

FIG. 10a the x-component of the magnetic field strength of a magnet with partial, complete or non-interrupted yoke; FIG. 10b the y-component oft he magnetic field strength of a magnet with partial, complete or non-interrupted yoke;

FIG. 10c the y-component of the magnetic field strength of a magnet with partial, complete or non-interrupted yoke;

FIG. 11 a magnet configuration controllable according to the invention as part of a magnetron.

In FIG. 1 is represented a U-form yoke 1 of iron or the like with a base area 2 and two lateral shanks 3, 4. On the upper edge of the two shanks 3, 4 is disposed a bar-form permanent magnet 5, 6 with rectangular cross section. The polarity of the two permanent magnets 5, 6 is opposite so that the magnetic field lines 7 have an arc shape between the permanent magnets. According to the invention into the shank 4 of the yoke 1 a circular rod 8 is inserted comprised in its longitudinal direction of two different materials 9, 10. The rod is rotatable in the direction of arrow 11 in the shank 4 of the yoke 1 since it is held solely through magnetic forces in a recess of shank 4 whose cross sectional area corresponds approximately to one half of the cross sectional area of rod 8. By rotating the rod the amplitude and shape of the magnetic field lines can be changed wherein the change is a function of the type of the material of the rod 8 which currently reaches into the recess of the shank.

In FIG. 2 is represented again the yoke 1 with the permanent magnets 5, 6 in cross section wherein, however, the shank 3 of the yoke 1 is provided with a rod 12. The rotational axis of the rod 12 which has a greater circumference than rod 8 lies outside of yoke 3. Rod 12 in this case is divided asymmetrically relative to the longitudinal axis. It also comprises two halves 13, 14 wherein the one half 14 is for example ferromagnetic while the other half 13 is nonmagnetic. Due to the asymmetric division ferromagnetic part can be moved completely out of the yoke without being in contact with its edges as is the case with rod 8. If the rods 8, 12 are rotated individually or jointly in the direction of the arrows 11, 15 the magnetic field 7 can be varied over a wide range with respect to amplitude and shape.

The thickness of the cross section D of yoke 2 and shanks 3, 4 should be dimensioned so that the magnetic flux coming from the permanent magnets 5, 6 can be carried without the material of yoke 1 being brought into saturation. If the thickness D is less than a given value so that the yoke 1 is operated in saturation only a significantly lesser portion of the flux can still be carried with the consequence that the short-circuit flux of the permanent magnets 5, 6 increases and the field strength between the two permanent magnets decreases. Because of the different materials of rods 8, 12 the magnetically effective thickness of yoke 1 can be readily varied. The rotation of the rods 8, 12 can take place manually or mechanically. In the case of mechanical rotation the rods 8, 12 are coupled for example with the rotary shaft of an electromotor disposed at a distance from the magnet.

A special advantage of the device shown in FIGS. 1 and 2 resides therein that in a field variation the position of magnets 5, 6 and yokes 2, 3, 4 are not changed.

In FIG. 3 is represented the left half of a magnet configuration with a yoke 1 and a permanent magnet 5. Of the two shanks 3, 4 only the shank 3 can be seen on the left side of the line of symmetry 16. Between the permanent magnet 5 and the shank 3 is disposed a magnetic return branch 17 which carries back to shank 3 a portion of the flux emanating from permanent magnet 5. The total flux $\Phi_C$ generated by the permanent magnet 5 is divided into the partial flux $\Phi_D$ and $\Phi_A$ at the return site 18 wherein the partial flux $\Phi_A$ represents the flux of the field lines which occur in the opposing permanent magnets not represented in FIG. 3. This flux $\Phi_A$ is guided back through the right shank (FIG. 2). Due to the losses of the free magnetic field 7 (FIG. 2) $\Phi_A$ is attenuated and appears in yoke 2 as flux $\Phi_B$.

At the second return site 19 the branched-off flux $\Phi_D$ is combined with flux $\Phi_B$ so that $\Phi_D + \Phi_B = \Phi_C$ is true. By inserting control rods 20, 21, 22 at different sites of the yoke $\Phi_B$, $\Phi_D$, and $\Phi_C$ can be influenced. It is for example possible to influence with the control rod 22 the effectiveness of the set-up flux guidances and consequently for example to influence the geometric height of the magnetic field.

In FIGS. 4a to 4c is shown a magnet which operates according to the principle represented in FIG. 3 and in which a control rod 23 is disposed at the return site 19. The control rod in cross section comprises a smaller nonmagnetic part 24 and a large magnetic part 25. If the control rod 23 assumes the position shown in FIG. 4a, the return flux $\Phi_D$ is reduced i.e. the return is attenuated.

In the position according to FIG. 4b the return reaches its maximum. Neither in the shank 3 nor in the branch 17 does a magnetic attenuation or damming take place.

FIG. 4c shows a position of the control rod 23 in which the return does indeed take place unattenuated, but the main branch of the shank 3, in contrast, is attenuated because the magnetically non-conducting material 24 is inserted into this branch and consequently $\Phi_A$ is further reduced. With the aid of the control rod 23 it is consequently possible to influence the return of the flux $\Phi_D$ more or less and consequently $\Phi_A$ and therewith to vary the magnetic field.

In FIG. 5 is represented a rotationally symmetrical magnet 30 having a yoke 31 in the form of a circular cylindrical tube with a floor 32 and carrying an annular permanent magnet 33 on its upper edge. From the center of the floor 32 extends a columnar yoke part 34 which at the level of the annular permanent magnet 33 carries a permanent magnet disk 35. The two permanent magnets 33, 35 are disposed in terms of polarity so that circular arc-form magnetic field lines 36 result. In the floor 32 are disposed two rings 37, 38 which can be shifted relative to one another and alternatingly have magnetically nonconducting and magnetically conducting segments. By shifting these rings 37, 38 the flux flowing over the entire yoke 31, 32, 34 can be controlled.

In FIG. 6 the floor plate 32 is represented again in a view from below wherein the individual segments 39 to 44 can be seen clearly. In the constellation .shown in FIG. 6 the magnetic flux between the two permanent magnets 35, 33 reaches a minimum because a magnetically conducting zone 39, 43 of a ring 37, 38 is in each instance opposite a magnetically nonconducting zone 42, 40 of the other ring. By relative rotation of the rings 37, 38 a nearly infinite variation of the magnetic reluctance between the permanent magnets 33, 35 is possible so that the field 36 is variable in any given way within given limits.

In FIG. 7 is represented a magnet 45 having on its cylindrical circumference rotatable rings 46, 47 with magnetically differently conducting districts 48, 49; 50, 51; 52, 53 etc. The magnetic flux herein is consequently not influenced at the floor 32 but rather at the cylinder surface 31.

In FIG. 8 is shown a device in cross section which corresponds to a combination of the devices according to FIGS. 5 and 7. Rotatable rings 46, 47 are provided on the cylindrical circumference as well as also rings 37, 38 on the floor. For control it is sufficient that in each instance only one of rings 46, 47 or 38, 37, respectively is rotatable while the in each instance other is disposed immovably. Through the outer control rings 46, 47 the magnetic field 36 is strongly changed at the margin in the direction toward the permanent magnet 33 while the inner control rings 37, 38 in the vicinity of the center of the floor plate 32 influence more strongly the magnetic field 36 around the center magnet 35.

It is further possible to vary the ratio of the individual districts 39, 40 or 39, 42 etc. in any given way.

FIGS. 9a to 9c show the effects calculated with a two-dimensional finite element program of the field influencing through a control of the magnetic flux in the yoke. For the calculation a magnetron configuration was selected with 10 mm×10 mm permanent magnets with a residual induction of $B_r=0.88$ T and a coercive field strength $_BH_c=6.7$ KA/cm as are used in comparable form in long cathodes of sputtering installations. Three cases were calculated: yoke uninfluenced, yoke strongly influenced, yoke completely interrupted. For simplification of the calculation a 10 mm×9 mm or a 10 mm×10 mm segment in the yoke was shifted. The abscissa and ordinate of FIGS. 9a to 9c give the dimensions in mm. These specifications vary between 60 mm and 150 mm.

In FIG. 9a is represented schematically a magnet 60 with yoke 61 and the permanent magnets 62, 63 wherein the vector potential $\vec{A}$ in a field not influenced by control rods or control rings is represented. Vector potential $\vec{A}$ and field strength $\vec{B}$ are connected through the equation $\vec{B}=\text{rot}\,\vec{A}$. $\vec{A}$ is consequently a vectorial field quantity with which can be represented the vectorial field quantity $\vec{B}$ of a source-free rotational field. To $\vec{A}$ can be added the gradient of any given scalar field function without $\vec{B}$ being changed thereby. In the narrow sense, the vector potential is here a vectorial field function determined by the curl of a magnetization whose curl supplies the magnetic induction.

If, as shown in FIG. 9b, a segment 64 with a 1 mm thick residual yoke 65 is taken, the vector potential is overall shifted and in the region of the right permanent magnet very clearly.

In a segment 64 which relates to the entire yoke thickness, as shown in FIG. 9c the field shift becomes even clearer.

In FIG. 10a is represented the x-component of the magnetic field strength as a function of the x-geometry of the magnet 60 according to FIGS. 9a to 9c. The curve 70 illustrates the case of the yoke not being influenced (cf. FIG. 9a) while the curve 71 shows the case in which the yoke is partially influenced. Curve 72 lastly represents the Bx-component for the case in which the yoke is completely interrupted. Corresponding curves for the y-component of the magnetic field are shown in FIG. 10b and there denoted by 70', 71', and 72' in order to establish the relation to FIG. 10a.

The curves 70", 71", 72" in FIG. 10c also show the By-component in an enlarged cross section. A shift of the passage through zero of the By-component can clearly be seen.

In FIG. 11 are represented two controllable magnet devices 100, 101 as part of a magnetron. These permanent magnets 100, 101 have in each instance two control rods 102, 103 or 104, 105, respectively, two permanent magnets 107, 108 or 109, 110, respectively, and a yoke 111 or 112, respectively. Both magnet devices 100, 101 are in a pot-form cathode 106 which is connected to a voltage/current supply 117. By 113 is symbolically indicated a target which is being sputtered. Above this target 113 is disposed a not-shown plasma. In the immediate vicinity of this substrate 114 is disposed an anode 115 which is for example at ground 116.

By rotating the control rods 102 to 105 the sputtering process can be influenced within given limits. Depending on how the magnetic field strength changes in the region of the target the sputtering process is influenced for example the target erosion, the firing behaviour, the plasma distribution, and the growth of the layer thickness.

I claim:
1. A magnet configuration comprising:
    at least two permanent magnets (5, 6; 33, 35) having a distance from each other;
    a stationary yoke (2, 3, 4; 31, 32, 34) connecting first opposite poles of said at least two permanent magnets (5, 6; 33, 35), whereas second poles of said magnets (5, 6; 33, 35) having different polarity are bridged by magnetic field lines through a fluid; and
    at least one rotatable body (8, 12; 37, 38) being arranged in a region of said stationary yoke (2, 3, 4; 31, 32, 34) and being rotatable in said yoke without linear movement with respect to said yoke, said rotatable body (8, 12; 37, 38) comprising at least two spatially separated solid materials with different magnetic properties, said properties differing in dependence upon an angle of an index rotating around a central axis of the rotatable body.
2. Magnet configuration as stated in claim 1, characterized in that the rotatable body is a rod (8, 12) extending over the depth of the yoke (2, 3, 4) and which is supported with one part in the yoke and is disposed with another part outside of the yoke (2, 3, 4).
3. Magnet configuration as stated in claim 1 or claim 2, characterized in that a magnetically conducting return branch (17) is provided which connects one pole of a permanent magnet (5) with the yoke (3).
4. Magnet configuration as stated in claim 3, characterized in that the rotatable body (23) is disposed in the transition region (19) between the yoke (3) and the magnetically conducting return branch (17) so that the magnetic conductivity of the return branch (17) and/or the yoke (3) is variable as a function of the rotational angle of the rotatable body (23).
5. Magnet configuration as stated in claim 1, characterized in that the rotatable body is a ring (37, 38) on the floor of a rotationally symmetrical magnet configuration (30) which has alternatingly regions of both better and less flux conducting magnetic material.
6. Magnet configuration as stated in claim 1, characterized in that the rotatable body is a ring (46, 47) on the circumference of a rotationally symmetrical magnet configuration (45) which has alternatingly regions of both better and less flux conducting magnetic material.

7. Magnet configuration as stated in claim 1, characterized in that it is used for sputtering sources according to the magnetron principle for etching and coating processes.

8. Magnet configuration as stated in claim 1, characterized in that the pole position of the permanent magnets (5, 6; 33, 35) relative to the yoke (2, 3, 4; 31, 32, 34) is selected so that between the pole areas a tunnel of magnetic field lines develops.

9. Magnet configuration as stated in claim 7, characterized in that two controllable magnet configurations (100, 101) are provided in a pot-form cathode (106) in front of which is disposed a target (113) to be sputtered which, in turn, is disposed opposite a substrate (114).

10. Magnet configuration as stated in claim 3, characterized in that the magnet configuration is used for sputtering installations according to the magnetron principle for etching and coating processes wherein the pole position of the permanent magnets (5, 6) relative to the magnet yoke (2, 3, 4) is selected so that a magnetic tunnel of magnetic field lines (7) results.

11. Magnet configuration as stated in claim 4, characterized in that the magnet configuration is used for sputtering installations according to the magnetron principle for etching and coating processes wherein the pole position of the permanent magnets (5, 6) relative to the magnet yoke (2, 3, 4) is selected so that a magnetic tunnel of magnetic field lines (7) results.

12. Magnet configuration comprising:

at least two permanent magnets (5, 6; 33, 35) having a distance from each other;

a yoke (2, 3, 4; 31, 32, 34) connecting first opposite poles of said first at least two permanent magnets (5, 6; 33, 35), whereas second poles of said magnets (5, 6; 33, 35) having different polarity are bridged by magnetic field lines through a fluid; and two rotatable bodies (8, 12; 37, 38) being arranged in a region of said yoke (2, 3, 4; 31, 32, 34), said rotatable bodies (8, 12; 37, 38) each comprising at least two spatially separated solid materials, said two solid materials having different magnetic properties from each other over an entire length of each of said solid materials; and characterized in that:

in the region of the yoke (2, 3, 4; 31, 32, 34) said two rotatable bodies (8, 12; 37, 38) are provided on which one body (12; 37) has a greater diameter than the other body (8; 38);

said yoke is fixed; and said two rotatable bodies have the same surface shape and are arranged in parallel over lengths of said two rotatable bodies.

13. Magnet configuration as stated in claim 12, characterized in that the axis of rotation of the body (12) with the greater diameter lies outside of the yoke (3).

14. Magnet configuration as stated in any one of claims 1, 2, or 4–9 or 10–11 characterized in that magnet configuration is used for sputtering installations according to the magnetron principle for etching and coating processes wherein the pole position of the permanent magnets (5, 6) relative to the yoke (2, 3, 4) is selected so that a magnetic tunnel of magnetic field lines (7) results.

* * * * *